(12) United States Patent
Botula et al.

(10) Patent No.: US 8,536,035 B2
(45) Date of Patent: Sep. 17, 2013

(54) SILICON-ON-INSULATOR SUBSTRATE AND METHOD OF FORMING

(75) Inventors: Alan B. Botula, Essex Junction, VT (US); Mark D. Jaffe, Shelburne, VT (US); Alvin J. Joseph, Williston, VT (US); Kenneth F. McAvey, Shelburne, VT (US); Gerd Pfeiffer, Poughquag, NY (US); Richard A. Phelps, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/363,603

(22) Filed: Feb. 1, 2012

(65) Prior Publication Data

US 2013/0196493 A1    Aug. 1, 2013

(51) Int. Cl.
*H01L 21/425* (2006.01)

(52) U.S. Cl.
USPC ............. 438/530; 438/455; 257/E21.211; 257/E29.002; 257/618

(58) Field of Classification Search
USPC ........... 257/E21.211, 618, E29.002; 438/455
See application file for complete search history.

(56) References Cited

U.S. PATENT DOCUMENTS

| 6,277,501 B1 * | 8/2001 | Fujikawa | 428/641 |
|---|---|---|---|
| 7,001,832 B2 * | 2/2006 | Neyret | 438/517 |
| 7,112,509 B2 | 9/2006 | Erokhin et al. | |
| 7,268,060 B2 | 9/2007 | Ghyselen et al. | |
| 7,586,154 B2 | 9/2009 | Ghyselen et al. | |
| 7,879,699 B2 | 2/2011 | Schulze et al. | |
| 7,883,990 B2 | 2/2011 | Levy et al. | |
| 7,977,705 B2 | 7/2011 | Nguyen et al. | |
| 2002/0090758 A1 * | 7/2002 | Henley et al. | 438/110 |
| 2004/0003769 A1 * | 1/2004 | Tamatsuka et al. | 117/13 |
| 2005/0124085 A1 * | 6/2005 | Andoh et al. | 438/17 |
| 2005/0202658 A1 * | 9/2005 | Neyret | 438/517 |
| 2006/0131649 A1 * | 6/2006 | Krautbauer et al. | 257/347 |
| 2009/0110898 A1 * | 4/2009 | Levy et al. | 428/221 |

FOREIGN PATENT DOCUMENTS

FR    2838865 A1    10/2003

OTHER PUBLICATIONS

Ourmazd et al., "Oxygen-related thermal donors in silicon: A new structural and kinetic model", Journal of Applied Physics, vol. 56, Issue 6, Sep. 1984.

* cited by examiner

*Primary Examiner* — N Drew Richards
*Assistant Examiner* — Ankush Singal
(74) *Attorney, Agent, or Firm* — Michael J. LeStrange; Hoffman Warnick LLC

(57) ABSTRACT

Silicon-on-insulator (SOI) structures and related methods of forming such structures. In one case, a method includes providing a silicon-on-insulator (SOI) handle substrate having: a substantially uniform resistivity profile along a depth of the handle substrate; and an interstitial oxygen ($O_i$) concentration of less than approximately 10 parts per million atoms (ppma). The method further includes counter-doping a surface region of the handle, causing the surface region to have a resistivity greater than approximately 3 kOhm-cm, and joining the surface region of the handle substrate with a donor wafer.

19 Claims, 5 Drawing Sheets

SILICON-ON-INSULATOR SUBSTRATE AND METHOD OF FORMING

FIELD OF THE INVENTION

The subject matter disclosed herein relates to a silicon-on-insulator based semiconductor structure. More specifically, the subject matter disclosed herein relates to a semiconductor structure having a silicon-on-insulator substrate with a high resistivity.

BACKGROUND

In certain wireless applications, high resistivity silicon-on-insulator (SOI) wafers are desirable in radio frequency (RF) devices capable of circuit linearity. Correlation studies show that RF performance continues to improve as wafer resistivity increases from 1 kilo-Ohm-centimeter (kOhm-cm) to greater than 10 kOhm-cm. However, despite the performance enhancement possible with higher resistivity in the RF wafer, that higher resistivity makes it difficult to discharge the wafer after processing with an electrostatic chuck (e.g., from the backside of the wafer).

BRIEF SUMMARY

Silicon-on-insulator (SOI) structures and related methods of forming such structures are disclosed. In various embodiments, a method includes providing a silicon-on-insulator (SOI) handle substrate having: a substantially uniform resistivity profile along a depth of the handle substrate; and an interstitial oxygen ($O_i$) concentration of less than approximately 10 parts per million atoms (ppma). In some embodiments, the method further includes counter-doping a surface region of the handle substrate causing the surface region to have a resistivity greater than approximately 3 kilo-Ohm-centimeters (kOhm-cm), and joining the surface region of the handle substrate with a donor wafer.

A first aspect of the invention includes a method including: providing a silicon-on-insulator (SOI) handle substrate having: a substantially uniform resistivity profile along a depth of the handle substrate; and an interstitial oxygen ($O_i$) concentration of less than approximately 10 parts per million atoms (ppma); counter-doping a surface region of the handle substrate causing the surface region to have a resistivity greater than approximately 3 kOhm-cm; and joining the surface region of the handle substrate with a donor wafer.

A second aspect of the invention includes a method including: providing a silicon-on-insulator (SOI) handle substrate having: a substantially uniform resistivity profile along a depth of the handle substrate; and an interstitial oxygen ($O_i$) concentration of less than approximately 10 parts per million atoms (ppma); implanting a backside region of the handle substrate to reduce a resistivity in the backside region of the handle substrate, the implanting leaving an existing resistivity of a surface region and a core region of the handle substrate substantially unchanged; and joining the handle substrate with a donor wafer.

A third aspect of the invention includes a silicon-on-insulator (SOI) wafer including: a substrate having a surface region, a core region and a backend region; a buried oxide layer over the substrate contacting the surface region; and a silicon layer over the buried oxide layer, wherein each of the backend region and the core region of the substrate are p-type doped with a resistivity of approximately 1-2 kOhm-cm and an interstitial oxygen concentration of approximately 10 parts per million atoms, and wherein the surface region is p-type doped, and has a depth of approximately 10-20 micrometers and a resistivity of greater than approximately 3 kOhm-cm.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
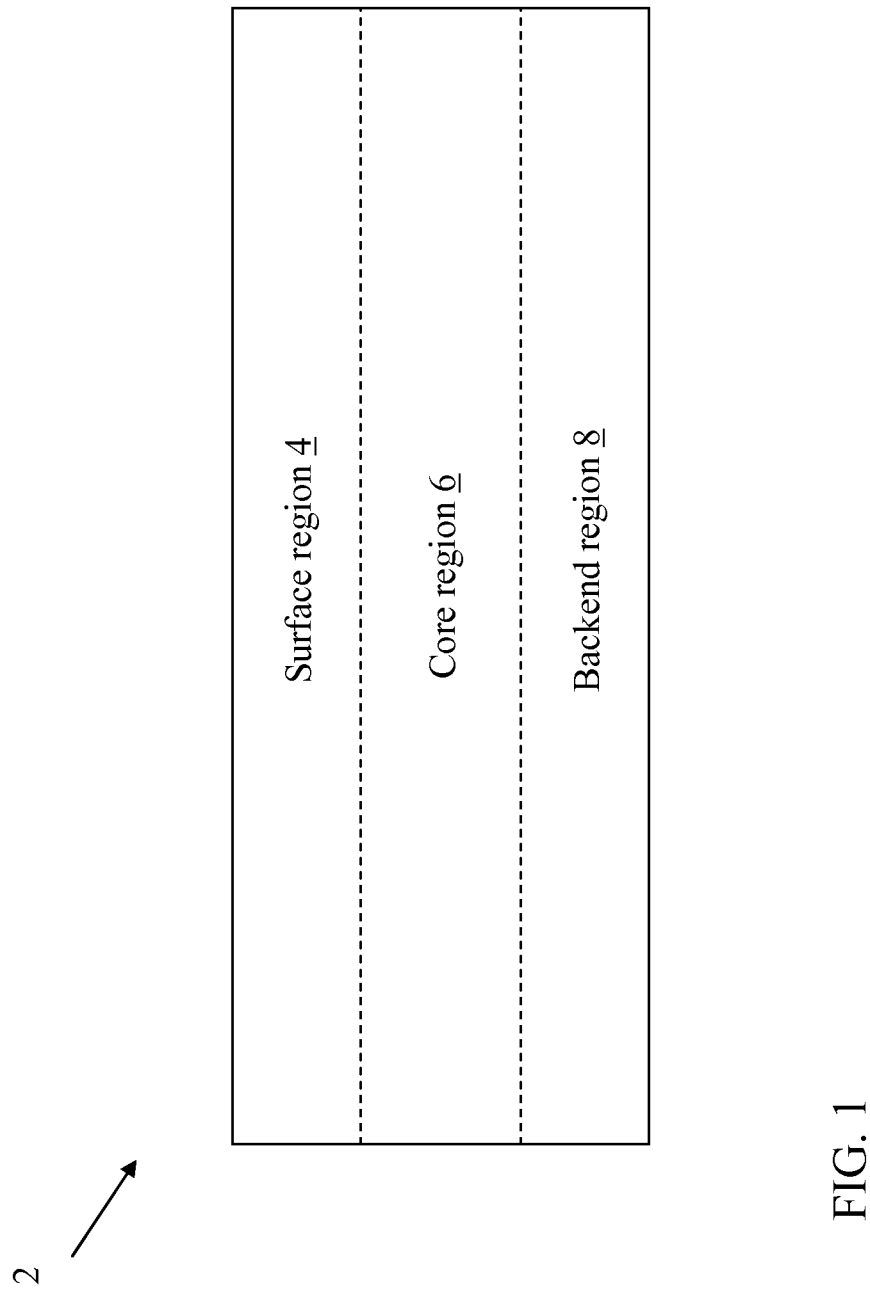
FIG. 1 is a side cross-sectional view of a silicon-on-insulator (SOI) wafer according to various embodiments of the invention.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted herein, the subject matter disclosed relates to a silicon-on-insulator (SOI) based integrated circuit structure. Various embodiments include an integrated circuit structure with a SOI resistivity profile that improves performance while enhancing the manufacturability of such structures.

As noted herein, in certain wireless applications, high resistivity silicon-on-insulator (SOI) wafers are desirable in radio frequency (RF) devices capable of circuit linearity. Correlation studies show that RF performance continues to improve as wafer resistivity increases from 1 kilo-ohm-centimeter (kOhm-cm) to greater than 10 kOhm-cm. However, despite the performance enhancement possible with higher resistivity in the RF wafer, that higher resistivity makes it difficult to discharge the wafer after processing with an electrostatic chuck (e.g., from the backside of the wafer).

Various embodiments of the invention provide for an improved SOI substrate with a resistivity profile including a higher resistivity proximate a surface of the substrate and a lower resistivity proximate a backend of the substrate. This resistivity profile can allow for enhanced performance of the SOI substrate (and associated device including the substrate), while improving manufacturability.

In some embodiments, the invention includes a method of forming a SOI structure. The method can include: providing a silicon-on-insulator (SOI) handle substrate having: a substantially uniform resistivity profile along a depth of the handle substrate; and an interstitial oxygen ($O_i$) concentration of less than approximately 10 parts per million atoms (ppma); counter-doping a surface region of the handle substrate to form either a high-resistivity (approximately 3 kOhm-cm or higher) or a near-intrinsic surface region (approximately 15 kOhm-cm or higher); and joining the surface region of the handle substrate with a donor wafer.

Other embodiments of the invention includes a method of forming a SOI structure. The method can include: providing a silicon-on-insulator (SOI) handle substrate having: a substantially uniform resistivity profile along a depth of the handle substrate; and an interstitial oxygen ($O_i$) concentration of less than approximately 10 parts per million atoms (ppma); implanting a backside region of the handle substrate to reduce a resistivity in the backside region of the handle substrate, the implanting leaving an existing resistivity of a surface region and a core region of the handle substrate substantially unchanged; and joining the handle substrate with a donor wafer.

In still other embodiments, a silicon-on-insulator (SOI) wafer is disclosed. The wafer can include: a substrate having a surface region, a core region and a backend region; a buried oxide layer over the substrate contacting the surface region; and a silicon layer over the buried oxide layer. The backend and core regions of the substrate are p-type doped with a resistivity of approximately 1-2 kOhm-cm and an interstitial oxygen concentration of approximately 10 parts per million atoms. The surface region is p-type doped or near-intrinsic, and has a depth of approximately 10-20 micrometers (um) and a resistivity of greater than approximately 3 kOhm-cm.

Turning to FIG. 1, a side cross-sectional view of a silicon-on-insulator (SOI) handle substrate 2 is shown according to embodiments of the invention. As shown, the handle substrate 2 is provided with a substantially uniform resistivity profile along its depth, such that a surface region 4 of the handle substrate 2 has a substantially identical resistivity as a core region 6 and a backend region 8. In various embodiments, the handle substrate 2 is initially p-type doped with a resistivity of approximately 1-2 kOHm-cm. The surface region 4 can include a plurality of circuit components, and in some cases can contain substantially all of the circuit components in the SOI handle substrate 2. In some cases, the backend region 8 is substantially entirely devoid of circuit components. In some cases, the surface region 4 is approximately 10 to 20 um thick. In various embodiments, the backend region 8 is approximately 50 to 500 nanometers (nm) thick. Additionally, the handle substrate 2 has a substantially uniform interstitial oxygen ($O_i$) concentration of less than approximately 10 parts per million atoms (ppma).

Figure 2:
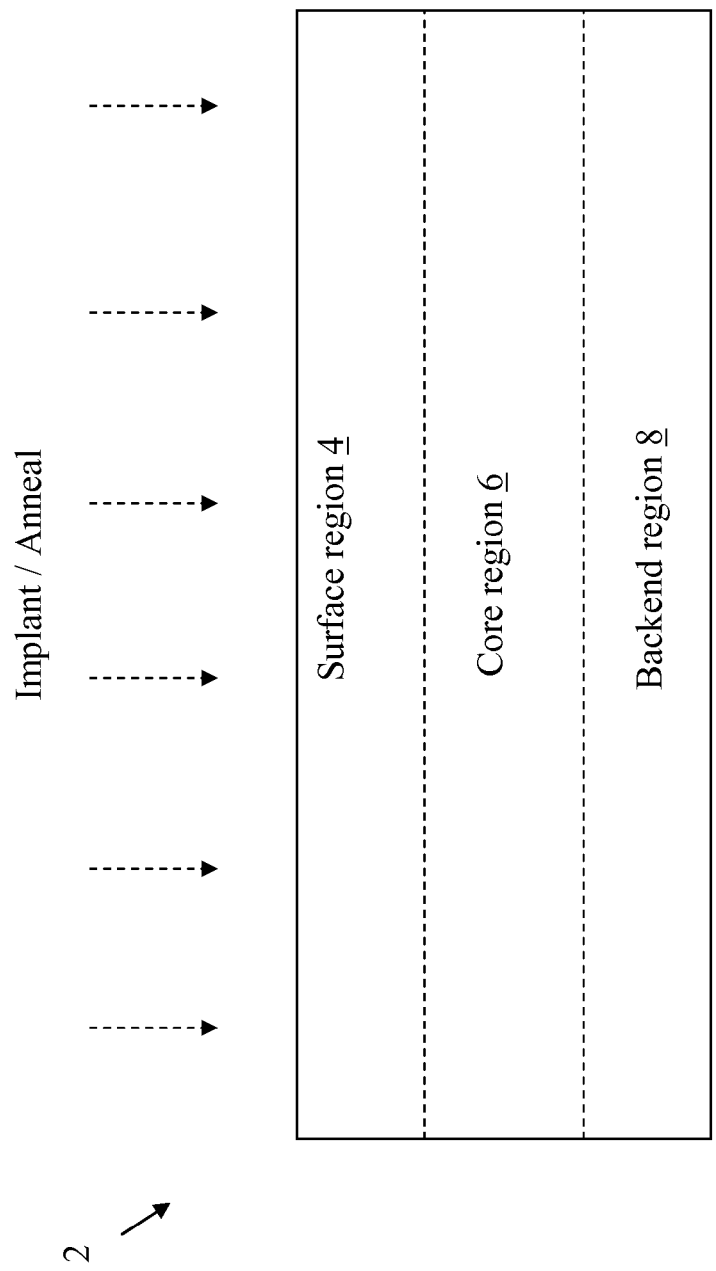
FIG. 2 is a side cross-sectional view of a SOI wafer undergoing processing according to various embodiments of the invention.

FIG. 2 illustrates a process in forming a SOI structure according to embodiments, whereby the surface region 4 of the handle substrate 2 is counter-doped (e.g., doped in a manner opposite its initial doping) in order to form a surface region 4 which has a resistivity greater than approximately 3 kOhm-cm (e.g., it is a high-resistivity region or a near-intrinsic region). It is understood that the term "high-resistivity" can refer to a resistivity of approximately 3 kOhm-cm to approximately 15 kOhm-cm, and the term "near-intrinsic" can refer to a resistivity of approximately 15 kOhm-cm or higher. As noted herein, the counter-doping process can form a surface region 4 having a resistivity ranging from approximately this high-resistivity level to approximately the near-intrinsic level. In some embodiments, the doping is performed by implanting the surface region 4 with at least one of phosphorous, arsenic or antimony. The doping can further include annealing the surface region 4 prior to subsequent SOI structure forming steps described herein. In particular embodiments, the doping includes implanting the surface region 4 and subsequently performing a denuding (e.g., uncovering) anneal to the surface region 4 to lower the $O_i$ content of approximately 10-20 micrometers (um) of the surface region 4. In any case, counter-doping of the surface region 4 increases the resistivity of the surface region 4 such that it has a resistivity greater than approximately 3 kOhm-cm (and in some cases, greater than 15 kOhm-cm). In some cases, this increase in resistivity is imparted on the surface region 4 to a depth of approximately 10-20 micrometers (um).

In other cases, the doping includes: determining a resistivity value and an $O_i$ concentration of the handle substrate 2, and doping the handle substrate 2 based upon the determined resistivity value and the $O_i$ concentration. That is, in these cases the resistivity of the handle substrate 2, and in particular the surface region 4 and/or the backside region 8 can be manipulated to meet a predetermined resistivity and/or $O_i$ concentration. This process could include conducting a conventional resistivity test of the handle substrate 2 (and in particular, the surface region 4), and in the case that the test indicates a lower than desired level of resistivity, doping the surface region 4 and/or annealing to increase resistivity in that region.

In various alternative embodiments, methods can include implanting the backside region 8 of the handle substrate 2 (FIG. 1) to reduce a resistivity in the backside region 8. In these embodiments, the implanting can leave an existing resistivity of a surface region 4 substantially unchanged. That is, this implanting extends to approximately 50 to 500 nanometers (nm) into the backside region 8, and does not reach the surface region 4.

Figure 3:
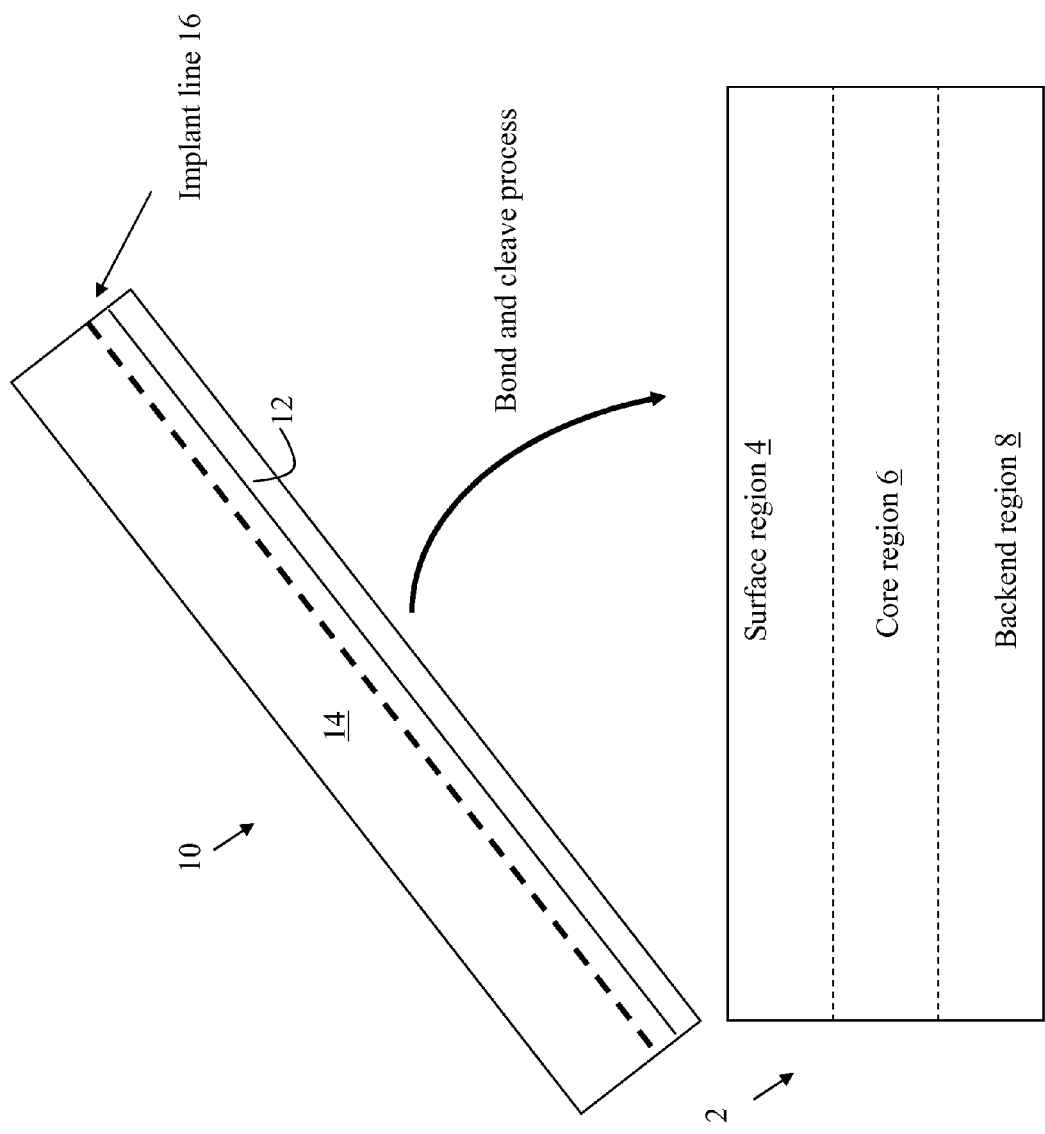
FIG. 3 is a side cross-sectional view of a SOI wafer undergoing processing according to various embodiments of the invention.

Following the doping process and/or the implanting process, various embodiments include joining the surface region of the handle substrate 2 with a donor wafer. This is illustrated in FIG. 3, whereby a conventional donor wafer 10 is joined with the handle substrate 2 at the surface region 4. As is known in the art of SOI wafer fabrication, the donor wafer 10 can be formed separately from the handle substrate 2, such that the donor wafer 10 includes an oxide layer 12 and a silicon-based layer 14. The donor wafer is traditionally implanted to a line (implant line 16) to cause amorphization for subsequent processing steps. The donor wafer 10 can be inverted after formation, and bonded to the surface region 4 of the handle substrate 2.

Figure 4:
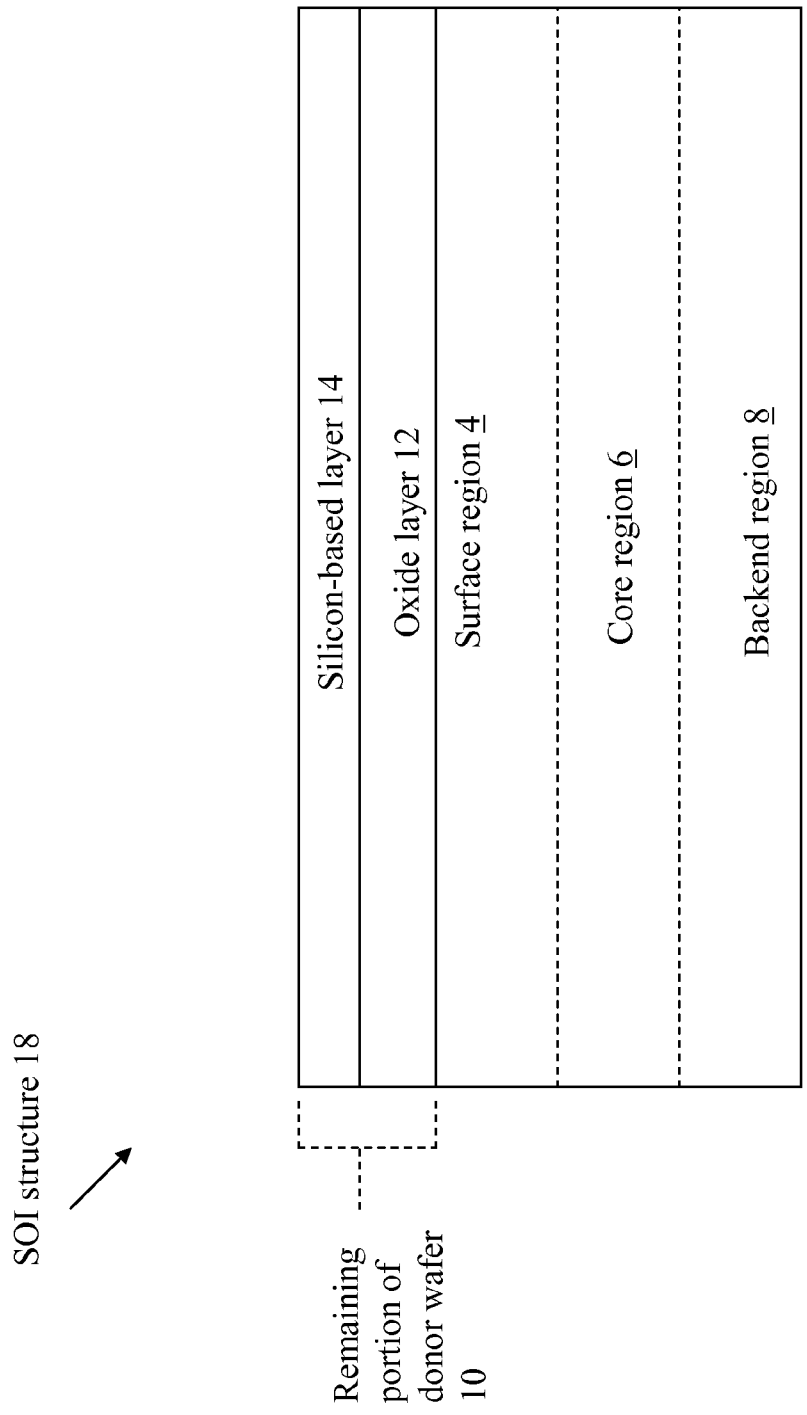
FIG. 4 is side cross-sectional view of a SOI structure according to various embodiments of the invention.

After bonding, as indicated in FIG. 4, the combined handle substrate 2 and donor wafer 10 can be annealed to form a fracture plane in the donor wafer 10 along the implant line 16 (FIG. 3). This fracture plane/implant line 16 defines a location of fracture in the silicon-based layer 14, where the silicon-based layer 14 can be removed from the implant line/fracture plane 16 upward. As these processes are known in the art, additional description has been omitted for enhanced clarity of invention. After removal of the portion of the silicon-based layer 14 above the implant line/fracture plane 16, the remaining portion of the silicon-based layer 14 can be polished (e.g., via chemical-mechanical polishing/planarization) as is known in the art.

The resulting SOI structure 18 is according to various embodiments of the invention is shown in FIG. 4. The SOI structure 18 can include: a) a substrate having a surface region 4 and a backend region; a buried oxide layer 12 over the substrate contacting the surface region 4; and a silicon layer (silicon-based layer 14) over the buried oxide layer. In some cases, the backend region of the substrate is p-type doped with a resistivity of approximately 1-2 kOhm-cm and an interstitial oxygen concentration of approximately 10 parts per million atoms. In various aspects, the surface region is counter-doped, and has a depth of approximately 10-20 micrometers and a resistivity of greater than approximately 3 kOhm-cm (and up or greater than 15 kOhm-cm). In any case, the surface region has a lower interstitial oxygen concentration than the core region.

As shown and described herein, various aspects of the invention include SOI structures having a resistivity gradient, and methods of forming such structures. In particular, various aspects of the invention include methods of forming a SOI structure that has an increased resistivity in the surface region, where circuitry and wiring are primarily located, and lower relative resistivity in the backend region. The higher resistivity in the circuit area can positively impact performance, while the lower resistivity in the backend can make the SOI structure easier to handle with a conventional electrostatic chuck. As is known in the art, electrostatic chucks can be used to hold and manipulate both insulating and conductive substrates for a variety of micro-fabrication processes. The SOI structures shown and described herein are easier to handle with an electrostatic chuck, as the portion in contact with that chuck (the backside region) has a resistivity of approximately 100 Ohm-cm or less.

It is understood that various embodiments can employ both enhancing the resistivity of the surface region and reducing the resistivity of the backside region of an SOI structure. In these cases, the core portion of the SOI structure may have a distinct resistivity from both of the backside region and the surface region.

Various embodiments described herein help to alleviate the resistivity decrease caused by conventional SOI processing. In particular, various embodiments described herein are designed to manipulate the interstitial oxygen concentration of portions of a SOI structure to modify the structure's resistivity. Even more specifically, various aspects are directed toward reducing the interstitial oxygen concentration in areas of a SOI structure in proximity to or housing circuitry. Reducing the interstitial oxygen concentration prevents a reduction in resistivity in these portions of the SOI structure during subsequent processing operations.

Figure 5:
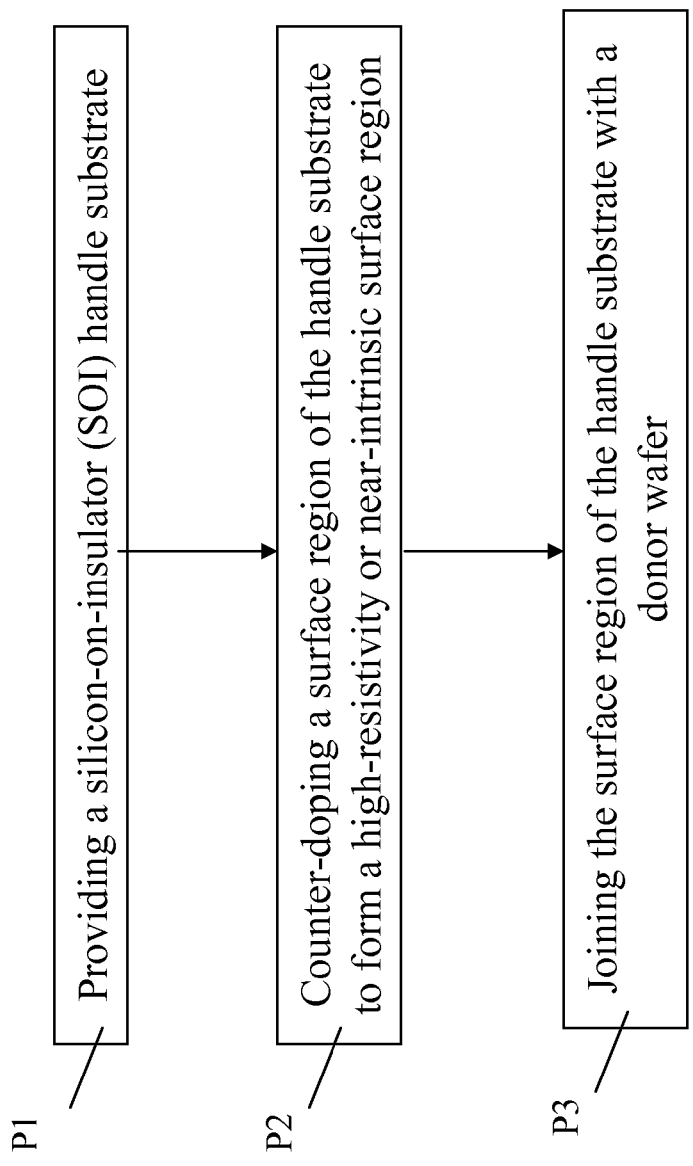
FIG. 5 is a flow chart illustrating processes according to various embodiments of the invention.

FIG. 5 is a method flow diagram illustrating processes according to various aspects of the invention. As shown, one method can include the following processes:

Process P1: providing a silicon-on-insulator (SOI) handle substrate. In some cases, as described herein, the SOI handle substrate can have a substantially uniform resistivity profile along a depth of the handle substrate, and an interstitial oxygen ($O_i$) concentration of less than approximately 10 parts per million atoms (ppma).

Process P2 (following process P1): counter-doping a surface region of the handle substrate to form a high-resistivity to near-intrinsic surface region. As described herein, in some cases, this can include implanting the surface region and subsequently annealing that region to reduce the interstitial oxygen concentration in that region.

Process P3 (following process P2): joining the surface region of the handle substrate with a donor wafer. As described herein, in various embodiments the joining can include bonding and annealing the handle substrate and the donor wafer.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A method comprising:
   providing a silicon-on-insulator (SOI) handle substrate having:
      a substantially uniform resistivity profile along a depth of the handle substrate; and
      an interstitial oxygen (CO concentration of less than approximately 10 parts per million atoms (ppma);
   counter-doping a surface region of the handle substrate causing the surface region to have a resistivity greater than approximately 3 kOhm-cm,
   wherein the counter-doping includes performing a denuding anneal to lower the $O_i$ content of the handle substrate in approximately 10-20 micrometers (um) of the surface region; and
   joining the surface region of the handle substrate with a donor wafer.

2. The method of claim 1, wherein the surface region substantially contains circuit components.

3. The method of claim 1, wherein the handle substrate is originally p-type doped with a resistivity of approximately 1-2 kOhm-cm.

4. The method of claim 1, wherein the doping includes at least one of implanting the surface region or annealing the surface region prior to the joining of the surface region with the donor wafer.

5. The method of claim 1, further comprising annealing the joined surface region of the handle substrate and the donor wafer to create a fracture plane in the donor wafer.

6. The method of claim 1, wherein the denuding anneal increases a resistivity of the surface region to approximately 10-20 micrometers (um) deep.

7. The method of claim 1, wherein the counter-doping includes:
   determining a resistivity value and an $O_i$ concentration of the handle substrate; and
   doping the handle substrate based upon the determined resistivity value and the $O_i$ concentration.

8. The method of claim 1, wherein the surface region is near-intrinsic, with a resistivity greater than approximately 15 kOhm-cm after the counter-doping.

9. A method comprising:
   providing a silicon-on-insulator (SOI) handle substrate having:
   a substantially uniform resistivity profile along a depth of the handle substrate; and
   an interstitial oxygen ($O_i$) concentration of less than approximately 10 parts per million atoms (ppma);
   implanting a backside region of the handle substrate to reduce a resistivity in the backside region of the handle substrate, the implanting leaving an existing resistivity of a surface region and a core region of the handle substrate substantially unchanged; and
   joining the handle substrate with a donor wafer.

10. The method of claim 9, wherein the surface region substantially contains circuit components and the backside region is completely devoid of the circuit components.

11. The method of claim 9, wherein the SOI handle substrate is originally p-type doped with a resistivity of approximately 1-2 kilo-Ohm-Centimeters (kOhm-cm).

12. The method of claim 9, wherein the implanting includes implanting the backside region with at least one of boron, phosphorus, arsenic, antimony or nitrogen.

13. The method of claim 9, further comprising annealing the joined handle substrate and the donor wafer to create a fracture plane in the donor wafer.

14. The method of claim 9, further comprising:
doping the surface region to increase a resistivity in the surface region before the joining of the handle substrate and the donor wafer.

15. The method of claim 14, wherein the surface region has a resistivity greater than approximately 3 kilo-Ohm-Centimeters (kOhm-cm) after the doping.

16. The method of claim 14, wherein the surface region has a resistivity greater than approximately 15 kilo-Ohm-Centimeters (kOhm-cm) after the doping.

17. A silicon-on-insulator (SOI) wafer comprising:
a substrate having a surface region, a core region and a backend region;
a buried oxide layer over the substrate contacting the surface region; and
a silicon layer over the buried oxide layer,
wherein each of the backend region and the core region of the substrate is p-type doped with a resistivity of approximately 1-2 kilo-Ohm-Centimeters (kOhm-cm) and an interstitial oxygen concentration of approximately 10 parts per million atoms, and
wherein the surface region has a depth of approximately 10-20 micrometers and a resistivity of greater than approximately 3 kOhm-cm.

18. The SOI wafer of claim 17, wherein the surface region has a lower interstitial oxygen concentration than the backend region.

19. The SOI wafer of claim 17, wherein the surface region further has a resistivity of greater than approximately 15 kOhm-cm.

* * * * *